United States Patent [19]

Burns

[11] Patent Number: 5,702,985
[45] Date of Patent: Dec. 30, 1997

[54] HERMETICALLY SEALED CERAMIC INTEGRATED CIRCUIT HEAT DISSIPATING PACKAGE FABRICATION METHOD

[75] Inventor: Carmen D. Burns, Austin, Tex.

[73] Assignee: Staktek Corporation, Austin, Tex.

[21] Appl. No.: 325,719

[22] Filed: Oct. 19, 1994

Related U.S. Application Data

[62] Division of Ser. No. 905,587, Jun. 26, 1992, abandoned.

[51] Int. Cl.$^6$ ................................................ H01L 21/60
[52] U.S. Cl. .......................... 437/217; 437/211; 437/218; 437/219; 437/220; 437/902; 257/676; 257/693; 257/703; 257/707
[58] Field of Search ............................ 437/207, 211, 437/217, 218, 219, 220, 902; 257/676, 693, 703, 707

[56] References Cited

U.S. PATENT DOCUMENTS

| | | | |
|---|---|---|---|
| 3,436,604 | 4/1969 | Hyltin et al. | 317/101 |
| 3,614,546 | 10/1971 | Avins | 317/234 R |
| 3,713,893 | 1/1973 | Shirland | 437/205 X |
| 3,739,462 | 6/1973 | Hasty | 29/577 |
| 4,079,511 | 3/1978 | Grabbe | 29/627 |
| 4,096,348 | 6/1978 | Robillard | 437/218 |
| 4,103,318 | 7/1978 | Schwede | 361/388 |
| 4,158,745 | 6/1979 | Keller et al. | 174/52 FP |
| 4,241,493 | 12/1980 | Andrulits et al. | 437/209 X |
| 4,288,841 | 9/1981 | Gogal | 361/414 |
| 4,321,418 | 3/1982 | Dran et al. | 264/102 X |
| 4,331,258 | 5/1982 | Geschwind | 220/359 |
| 4,426,657 | 1/1984 | Abiru et al. | 357/29 |
| 4,437,235 | 3/1984 | McIver | 29/840 |
| 4,451,973 | 6/1984 | Tateno et al. | 29/588 |
| 4,521,828 | 6/1985 | Fanning | 361/386 |
| 4,525,921 | 7/1985 | Carson et al. | 29/577 |
| 4,630,172 | 12/1986 | Stenerson et al. | 361/386 |
| 4,633,573 | 1/1987 | Scherer | 29/589 |

(List continued on next page.)

FOREIGN PATENT DOCUMENTS

| | | | |
|---|---|---|---|
| 0340100 | 4/1989 | European Pat. Off. | |
| 1952789 | 4/1970 | Germany | 437/218 |
| 0052370 | 4/1977 | Japan | 437/217 |
| 57-31166 | 2/1982 | Japan | |
| 58-96756 A | 6/1983 | Japan | |

(List continued on next page.)

OTHER PUBLICATIONS

K.P. Stuby "Flexible Semiconductor Credit Card", IBM Tech. Dis. Bull., vol. 22, No. 6, Nov. 1979.

Information allegedly written by Emory Garth regarding "Memory Stacks," Applicant received a facsimile from Emory Garth on Jan. 26, 1993.

Catalog of Dense-Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870.

Christian VAL and Thierry Lenoine, "3D Interconnection for Ultra-Dense Multichip Modules", IEEE, pp. 540–547.

Dean Frew, "High Density Memory Packaging Technology High Speed Imaging Applications," SPIE, vol. 1346 Ultra-high-and High-Speed Photography, Videography, Photonics, and Velocimetry '90, pp. 200–209.

Alvin Weinberg and W. Kinzy Jones, "Vertically-Integrated Package," IEEE, pp. 436–443.

Primary Examiner—John Niebling
Assistant Examiner—Long Pham
Attorney, Agent, or Firm—Fulbright & Jaworski L.L.P.

[57] ABSTRACT

A method for achieving a hermetically sealed ceramic integrated circuit package having good thermal conductivity for efficiently transferring heat from an integrated circuit chip die contained therein. Use of an ultra-thin integrated circuit chip die, thin ceramic housing layers and external lead frame allow an ultra-thin overall package that may be used singularly or further densely packaged into a three dimensional multi-package array and still meet the critical performance and reliability requirements for both military and aerospace applications.

56 Claims, 14 Drawing Sheets

U.S. PATENT DOCUMENTS

| | | | |
|---|---|---|---|
| 4,680,617 | 7/1987 | Ross | 357/72 |
| 4,684,975 | 8/1987 | Takiar et al. | 357/70 |
| 4,722,060 | 1/1988 | Quinn et al. | 364/490 |
| 4,733,461 | 3/1988 | Nakano | 29/830 |
| 4,758,875 | 7/1988 | Fujisaki et al. | 357/72 |
| 4,758,926 | 7/1988 | Herrell et al. | 361/385 |
| 4,763,188 | 8/1988 | Johnson | 357/74 |
| 4,796,078 | 1/1989 | Phelps, Jr. et al. | 357/68 |
| 4,821,148 | 4/1989 | Kobayashi et al. | 361/392 |
| 4,823,234 | 4/1989 | Konishi et al. | 361/386 |
| 4,829,403 | 5/1989 | Harding | 361/386 |
| 4,833,568 | 5/1989 | Berhold | 361/383 |
| 4,839,717 | 6/1989 | Phy et al. | 357/74 |
| 4,855,868 | 8/1989 | Harding | 361/386 |
| 4,862,245 | 8/1989 | Pashby et al. | 357/70 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,891,789 | 1/1990 | Quattrini et al. | 365/63 |
| 4,948,645 | 8/1990 | Holzinger et al. | 156/252 |
| 4,953,005 | 8/1990 | Carlson et al. | 357/80 |
| 4,953,060 | 8/1990 | Lauffer et al. | 361/388 |
| 4,994,411 | 2/1991 | Naito et al. | 437/217 |
| 4,997,517 | 3/1991 | Parthasarathi | 156/630 |
| 4,997,718 | 3/1991 | Dumesnil et al. | 428/426 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 357/80 |
| 5,065,277 | 11/1991 | Davidson | 361/383 |
| 5,086,018 | 2/1992 | Conru et al. | 437/237 |
| 5,099,393 | 3/1992 | Bentlage et al. | 361/413 |
| 5,108,553 | 4/1992 | Foster et al. | 29/852 |
| 5,122,862 | 6/1992 | Kajihara et al. | 357/74 |
| 5,138,434 | 8/1992 | Wood et al. | 357/74 |
| 5,151,559 | 9/1992 | Conru et al. | 174/52.4 |
| 5,159,434 | 10/1992 | Kohno et al. | 357/80 |
| 5,214,845 | 6/1993 | King et al. | 29/841 |
| 5,236,117 | 8/1993 | Roane et al. | 228/180.21 |
| 5,240,588 | 8/1993 | Uchida | 437/218 |
| 5,243,133 | 9/1993 | Engle et al. | 174/52.4 |
| 5,260,514 | 11/1993 | Fruen, Jr. | 174/52.4 |
| 5,307,929 | 5/1994 | Seidler | 206/331 |

FOREIGN PATENT DOCUMENTS

| | | |
|---|---|---|
| 58-112348 | 7/1983 | Japan |
| 1219143 | 9/1986 | Japan |
| 63-53959 | 3/1988 | Japan |

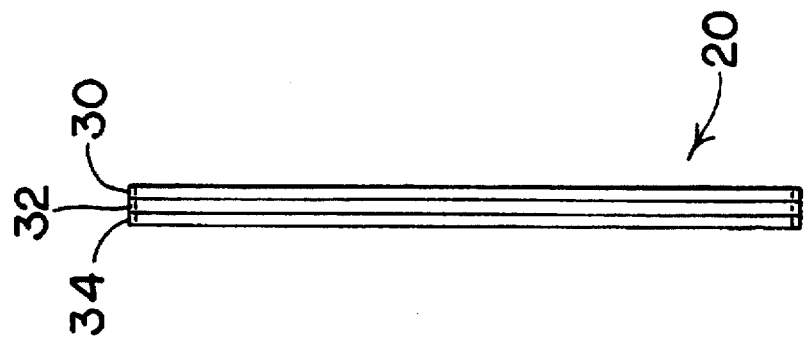
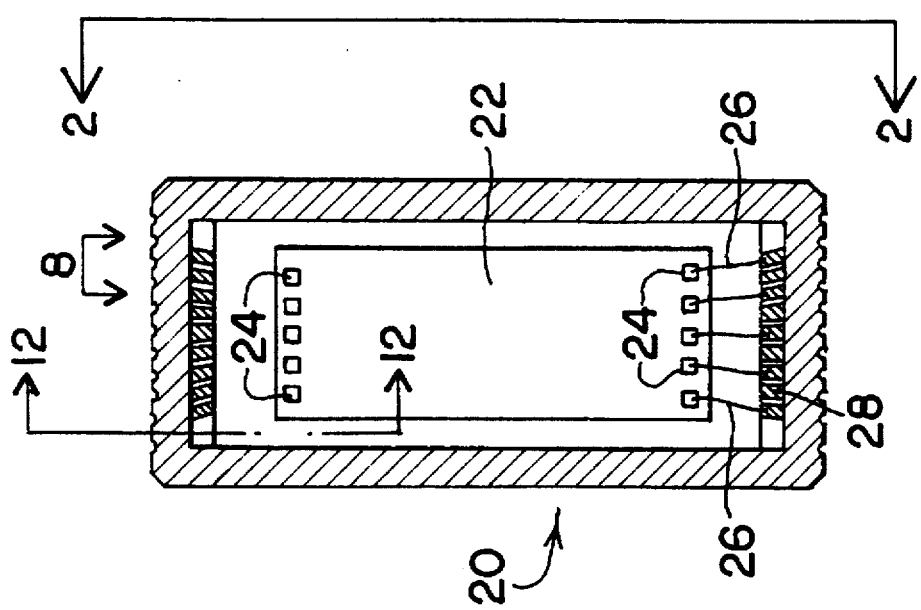

HERMETICALLY SEALED CERAMIC INTEGRATED CIRCUIT HEAT DISSIPATING PACKAGE FABRICATION METHOD

This is a divisional of application Ser. No.07/905,587, filed Jun. 26, 1992, now abandoned.

BACKGROUND OF THE INVENTION

1. Field of the Invention

This invention relates to a method and apparatus for fabricating hermetically sealed ceramic integrated circuit packages. In particular, the invention relates to a hermetically sealed ceramic integrated circuit package that efficiently transfers heat from the integrated circuit chip within the package.

2. Discussion of the Related Technology

Military and aerospace applications require highly reliable electronic systems. These systems may be used, for example, in life or death situations such as in jet fighter weapons and life support systems. Critical systems must not have a failure mode that cannot be corrected. If an orbiting space satellite shuts down due to electronic equipment failure, it cannot be repaired. The satellite becomes inoperative and millions of dollars are wasted. Therefore, for these ultra-critical applications, electronic circuits and the packaging thereof must be the finest and most reliable available. Military specifications such as Mil. Spec. 883-B require, among other things, a hermetically sealed package which house an electronic integrated circuit.

Ceramic material is normally used in packaging the integrated circuits to military specifications because of its reliability, heat dissipation characteristics, resistance to vapor and gas penetration, and electrical insulation properties. Fabrication of integrated circuit ceramic packages are well known in the art and have been used extensively in all critical aerospace and military applications. The present ceramic packages are relatively thick, however, and do not facilitate high density packaging or efficient heat transfer from the integrated circuit chip die.

In most military and aerospace applications, no thermal convection cooling of the integrated circuit packages is allowed, all heat transfer must be done by conduction from a substrate away from the integrated circuit package. Conduction of heat from the integrated circuit chip die may be through the metal lead connections or package into the electronic system heat dissipation means such as, for example, a thermally conductive substrate associated with a printed circuit board of the system.

Prior art hermetically sealed ceramic integrated circuit packages are large and bulky, resulting in inefficient packaging that is incapable of miniaturization sufficient for today's sophisticated electronic technology. As military weapon systems, such as smart bombs and advanced tactical electronic warfare systems are used in smaller and faster rockets and aircraft, respectively, the need for higher packaging density becomes more critical. Likewise, in space satellite technology, unnecessary size and weight costs dearly during launch and may affect the reliability and useful operating life of the satellite while in orbit.

Packaging techniques for integrated circuit technology are being developed in an attempt to satisfy demands for miniaturization in the semiconductor industry. Improved methods for miniaturization of integrated circuits enabling the integration of millions of transistor circuit elements into single integrated silicon embodied circuits, or chips, have resulted in increased emphasis on methods to package these integrated circuit chips in space efficient, yet reliable and mass producible packages.

An integrated circuit chip is comprised of many interconnected transistors and associated passive circuit elements that perform a function or functions. These functions may include computing, memory data storage, communications, weapons and fire control, etc. Different types of integrated circuit chips are used to create electronic systems to perform specific functions. Combining the functions of different integrated circuit chips requires electrically connecting each integrated circuit chip circuit into the circuits of the system. In order to accomplish this interconnection, conductive paths must be made available to connect the internal circuitry of an integrated circuit chip to the external electrical circuits of the system.

Military specification hermetically sealed ceramic integrated circuit packages may sandwich an integrated circuit chip die and interconnection means between a ceramic or metal element. Various methods of hermetically sealing the ceramic integrated circuit packages are well known in the integrated circuit industry. Either leaded or smaller leadless hermetically sealed package integrated circuit packages bring the integrated circuit chip electrical connections through the ceramic material and to the outer surface of the integrated circuit ceramic package. System electrical connections are made to these external ceramic package connections.

SUMMARY OF THE INVENTION

In contrast to such prior technology, the packaging method and apparatus of the present invention attaches an integrated circuit chip die to a hermetically sealable ceramic housing in such a way as to enhance thermal conduction of heat from the chip die. This ceramic housing is also in communication with a metal lead frame that further enhances the thermal transfer of heat from the ceramic material and integrated circuit chip die. Heat transfer is improved by reducing the thickness of the materials between the chip die and the heat conductive lead frame. In addition, the present invention reduces the integrated circuit chip die thickness further improving heat transfer and permitting a thinner overall package.

The present invention provides a method and apparatus for attaching an integrated circuit chip die to a ceramic housing and laminating a lead frame to the housing. The present invention comprises an integrated circuit package that meets military and aerospace specifications with improved thermal transfer characteristics. The improved thermal transfer characteristics result in better dissipation of heat from the integrated circuit die with a subsequent improvement in overall system reliability.

In order to achieve the thinnest package possible all fabrication layers needed to construct a useful integrated circuit package must be minimized in thickness and number. The present invention discloses an ultra-thin package which results from reducing the number of layers and the thickness of each layer to a minimum during fabrication of the package elements. The present invention discloses a novel manufacturing process for assembling hermetically sealed ceramic integrated circuit packages in a cost effective and simple to use assembly process. The present invention discloses a packaging arrangement that facilitates the use of standard size ceramic packages for difference size and function integrated circuit chip dies by means of lead-on-chip lead frames adapted for each type and size of chip die.

These lead-on-chip lead frames may be supported or unsupported and have the bond pads in the center of the die or on the edges of the die, as more fully illustrated in co-pending U.S. patent application Ser. No. 07/746,268 by Burns, filed Aug. 15, 1991, now U.S. Pat. No. 5,521,642 entitled "Lead-On-Chip Integrated Circuit Fabrication Method and Apparatus", and incorporated herein by reference for all purposes.

The packing density and performance of electronic circuits may be improved by stacking the integrated circuit packages closely together such as, for example, in a three dimensional array. Various embodiments of three dimensional integrated circuit array stacks are more fully illustrated in U.S. Pat. Nos. 5,420,751 and 5,446,620, respectively; entitled "Ultra High Density Integrated Circuit Packages Method and Apparatus", and incorporated herein by reference for all purposes. More integrated circuit packages may be stacked in a given space if the integrated circuit packages used are ultra-thin. However, there is a trade off in the resulting package being able to dissipate the heat generated by the active electronic elements contained therein. The present invention improves both packaging density and heat dissipation characteristics, resulting in a small package having higher packing density and improved power dissipation capacity.

The preferred embodiment of the present invention uses a ceramic housing manufactured by Coors Electronics Package Company. This ceramic housing is comprised of three thin layers: (1) a ceramic base, (2) metal on ceramic wire bond pads, and (3) metal on ceramic seal ring. These three layers are fused together to form a hermetically sealable ceramic housing. The integrated circuit chip die is lapped to a thickness of approximately 5.5 mils. The lapped integrated circuit chip is attached inside of the ceramic housing by firing silver-loaded glass placed between the bottom surface of the chip die and the base layer of the ceramic housing.

The integrated circuit chip has connection pads that are aluminum wedge bonded to the wire bond pads of the ceramic housing. The ceramic housing wire bond pads are brought out to the external surface of the housing at castellations placed along the edges of the ceramic housing. After the chip die is attached in the ceramic housing and the aluminum wire bond connections are made, this partially fabricated integrated circuit may be placed in a nitrogen filled oven where the ceramic housing and, for example, a kovar lid are hermetically sealed together.

Hermetic sealing takes place when preformed solder fillets on both the kovar lid and the ceramic housing seal ring layer reflow together. After the reflow soldered lid and housing seal ring cool, the hermetically sealed integrated circuit package may be removed from the oven. Inert nitrogen gas remains within the hermetically sealed inner cavity formed by the ceramic housing and lid. Alternative means of hermetically sealing the ceramic housing are seam or laser welding of a metal lid, and ceramic lid with glass seal.

The ceramic housing may be, for example, 22 mils thick, wherein the base layer may be 8 mils, the wire bond pad layer 7 mils, and the seal ring layer 7 mils. The integrated circuit chip die is lapped to a thickness of approximately 5 mils which improves its thermal conductivity in addition to minimizing package thickness requirements. The silver-loaded glass used to attach the die to the ceramic base layer may be 2 mils thick. The inside cavity of the ceramic housing may be 14 mils deep, leaving at least 8 mils clearance for aluminum wire bond connections to the integrated circuit chip connection pads. The kovar lid may add an additional 7 to 10 mils to the hermetically sealed ceramic package thickness. The solder seal used to seal the kovar lid to the ceramic housing may be 2 mils thick, for example, gold/tin (80/20) preform. The package of the present invention greatly improves the heat dissipation because of the low thermal resistance of the ultra thin chip die and base layer. These ultra thin elements of the present invention allow faster and more efficient heat transfer from the integrated circuit chip die to the lead frame and ultimately into the equipment heat dissipation means.

The integrated circuit chip may be tested after it is hermetically sealed within the ceramic housing, as described above. At least two types of testing may be performed at this stage of packaging. The integrity of the hermetic seal may be tested for leakage in accordance with Military Standard 883, method 1014–5. If an integrated circuit package fails a test, the method and apparatus of the present invention lends itself to easy rework and/or inspection of the rejected packages. After mechanically testing the hermetic seal of the ceramic integrated circuit package, a lead frame having a plurality of electrical conductors is laminated onto an exterior face of the ceramic housing base layer, i.e., bottom surface of the integrated circuit ceramic package. The lead frame is shaped so that each of the electrical conductors attaches to each of the ceramic housing castellations by, for example, solder, ultrasonic weld or thermal compression. Each of these external castellations are connected to each of the wire bond pad connections which are connected to each of the integrated circuit chip connection pads, respectively.

The lead frame is laminated to the bottom of the ceramic integrated circuit package with a thin adhesive that may be, for example, only 0.3 mils thick. Close communication of the metal lead frame to the bottom face of the ceramic housing greatly improves the thermal conductance of the overall ceramic package. Ceramic is a medium conductor of heat, whereas metal is an excellent conductor.

Heat from the integrated circuit chip adequately conducts through the attachment means which may be, for example, 2 mil thick silver-glass or thermally filled polymer, and the 8 mil thick ceramic base layer. The heat from the integrated circuit chip passing through the thin ceramic base layer, however, must also be conducted elsewhere for ultimate dissipation.

The present invention utilizes the high thermal conductance of the metal lead frame to effectively absorb and transfer the heat flow from the integrated circuit chip through the thin ceramic base layer. The metal lead frame surface area is maximized to obtain the most efficient heat flow. Ultimately, the heat flowing through the lead frame dissipates into the electronic system connection interface, for example, a multi-layer printed circuit board.

In addition to adequate heat dissipation for the integrated circuit chip die, the integrated circuit package must also protect the integrated circuit chip transistors from alpha particle bombardment and photon emissions from light sources. Both alpha particles and photons may cause hard and soft data errors in digital electronic systems. Polymeric film may be used as an alpha barrier as suggested in U.S. Pat. No. 4,426,657 by Abiru, et al. High temperature polymer coatings such as, for example, polyimide may be placed over the face of the integrated circuit chip die and the polyimide will effectively act as a barrier to the alpha particles.

The polymer used may be, for example, high temperature, low moisture polyimide of the additive reaction type wherein no water is generated in its process of formation.

Polymers of the additive reaction type are preferred over polymers of the condensation reaction type because of the requirement of minimizing the moisture content of the integrated circuit package. By judicious use of high temperature low moisture polymers, the present invention may easily meet the demanding specifications required of ceramic packaging.

Light or photon absorption in the integrated circuit chip die may result in soft data errors. The ceramic base layer, being only 8 mils thick, may allow undesirable light to enter the cavity of the housing containing the integrated circuit chip die. Opaque ceramic materials should be used to prevent photon entry into the ceramic package.

An kovar lid insulated with a polymer coating will prevent electrical shorting of the conductive lead frame and leads when multiple integrated circuit packages are stacked one on top of another. This polymer coating may be, for example, 0.5 mil thick high temperature polymer such as, for example, a polyimide film layer and will prevent the lead frame of the upper package from shorting to the metal lid of the lower package. This allows for extremely tight and compact packing densities in a level II package as more fully described in U.S. Pat. No. 5,420,751 by Burns. In addition, this film layer may be used as a solder mask to prevent solder from coming into contact with the solder seal filet of the ceramic package lid.

The method and apparatus of the present invention results in a reliable, cost efficient and easily manufactured hermetically sealed ceramic integrated circuit package useful for both military and aerospace applications. The packaging method of the present invention utilizes substantially thinner elements that contribute greatly to the efficient transfer of heat and, in addition, allow fabrication of an ultra thin level-one package. The present invention has particular utility in any number of high density space sensitive applications requiring ultra thin integrated circuit packaging.

The improved thermal conduction of this package lowers the junction temperatures of the transistors in the integrated circuit chip, improving the reliability of the entire electronic system. Having an improved thermally conductive package allows higher thermal density applications without degradation to overall system performance or reliability. These aspects are critical to reliable military and aerospace electronic systems.

All of the above advantages of the present invention may be utilized with a standard size ceramic package for housing various sizes of integrated circuit chip dies. Electronic technology is advancing so rapidly that changes in electrical configuration and physical size are the rule not the exception. This rapidly changing technology creates uncertainty for mechanical package and system designers. Therefore, a standardized integrated circuit package that can be adapted for various types of chip dies is needed. Another embodiment of the present invention meets this challenge, along with all of the other above mentioned advantages.

A lead-on-chip integrated circuit chip assembly may be adapted for connection within a standard housing of the present invention. A detailed description of the method and apparatus of preferred embodiments of lead-on chip technology are more fully described in co-pending applications Ser. No. 07/746,268, filed Aug. 15, 1991 now U.S. Pat. No. 5,521,642 and Ser. No. 07/783,737, filed Oct. 28, 1991 now U.S. Pat. No. 5,194,529 both by Burns and incorporated herein by reference for all purposes.

Both supported and unsupported lead-on-chip lead frames may be adapted for attachment and connection to a specific integrated circuit chip die. The lead-on-chip lead frame may be designed so as to connect within the standard ceramic housing independent of chip die size or chip pad connection configurations. Thus, by fabricating a specific lead frame adapted for attachment and connection to a specific chip die, the ceramic housings of the present invention may be designed without regard to any specific chip die or pad layout thereon. In addition, prior art ceramic housings may be utilized with various chip dies using lead-on-chip lead frames adapted for connecting the prior art housing connections to the chip die bond pads.

The present invention may use metal ground planes for improved noise reduction and heat transfer dissipation. A metal ground plane may be utilized between the face of the chip die and the lead frame and/or between the bottom of the ceramic housing and the housing lead frame. A unique aspect of the present invention is a heat spreading metal Found plane either between the face of the IC chip and the lead frame, above the lead frame or both using two ground planes sandwiching the lead frame therebetween. By electrically connecting the metal ground plane to appropriate electrical connections within the electronic system, electrical noise may also be greatly reduced.

Selection of the lead frame conductor dimensions and spacing between the metal ground plane affords a controlled impedance of the lead frame conductors for improved high frequency operation of the IC devices. The metal ground plane and lead frame conductors may form either a stripline or microstrip system when using one or two ground planes, respectively. Design of stripline and microstrip systems are well known in the radio frequency arts.

Use of ground planes to reduce IC circuit noise and/or to control signal impedances allows improvements in the operating speeds of ICs such as static random access memory (SRAM) and dynamic random access memory (DRAM). Both SRAM and DRAM are used to store digital data and are sensitive to system noise and signal settling times. Signal settling time is the time required for a signal to obtain a stable state without noise present such as ringing or standing wave reflections. Both of these noise types result from impedance mismatching in a high frequency signal system.

Ground induced noise may also be present because of inadequate conductor size. High frequency currents resulting from rapid switching speeds tend to travel only on the surface of a metal conductor and is called the "skin effect". By making the surface area of conductors required to carry large and rapidly changing ground currents, ground noise due to charging and discharging circuit capacitance when switching logic states is greatly reduced.

The ground plane of the present invention may be used to spread heat flow, it may also be used to reduce noise, or it may additionally be used in conjunction with the lead frame conductors for constant impedance signal transmission lines. The ground plane may extend out from the integrated circuit chip for connection to a heat dissipation system, noise grounding system and/or constant impedance signal transmission system integral with the ceramic housing.

Holes in the metal ground plane may be placed to easily facilitate interconnection of the lead frame to the IC chip connection pads. Different patterns of holes may be used for chip connection pads on the perimeter or within the interior plane of the chip face. The ground plane may be connected to selected conductors of the lead frame or to external connections independent of the lead frame. Multiple electrical or thermal mechanical connections to the ground plan will improve the effective noise reduction and heat dissipation properties of the IC package, respectively.

The present invention may also use a thin layer of metal such as, for example, copper or metalized ceramic on the bottom of the ceramic package. This metal is heat conductive and may be used to increase the thermal conductivity of the ceramic package because it will spread the heat better.

The present invention solves the problem of removing heat generated from the operation of electronic circuit elements within closely packed IC packages. The above embodiments of the present invention improve the thermal conductivity between the IC die, the lead frame, and heat spreading ground plane and for the embodiments of the invention to act more efficiently as an effective heat sink whether used with the normally thick prior art ceramic packages or the new ultra-thin ceramic packages of the present invention.

An object of the present invention is a method of manufacturing a hermetically sealed ceramic integrated circuit package having good thermal conductivity for efficiently transferring heat from an integrated circuit chip die contained therein by attaching an integrated circuit chip into a ceramic housing comprising a base, wire bond pads and seal ring, and connecting the integrated circuit chip electrical circuits to external connection pads, attaching a cover to the ceramic housing, hermetically sealing the integrated circuit chip within, laminating a lead frame to the ceramic housing base and using this lead frame for both electrical connections and transfer of heat from the integrated circuit chip die.

Yet another object of the present invention is a hermetically sealed ceramic integrated circuit package having good thermal conductivity for efficiently transferring heat from an integrated circuit chip die where the chip die is attached to a ceramic housing and electrical connections are made from the chip die to external connections on the housing, the integrated circuit chip is hermetically sealed within the ceramic housing and a lead frame is laminated to the bottom of the ceramic housing for electrical connections and conduction of heat.

A further object of the present invention is to use an integrated circuit chip die that is 5 mils thick.

Still a further object of the present invention is a thin ceramic housing comprised of three thin layers, a ceramic base, metal on ceramic wire bond pad and metal on ceramic seal ring layers fused together to form a hermetically sealable ceramic housing.

Yet a further object of the present invention is to have a ceramic housing comprised of a ceramic base, metal on ceramic wire bond pad, and metal on ceramic seal ring layers, for example, 8 mils, 7 mils, and 7 mils thick, respectively.

A further object of the present invention is to attach the integrated circuit chip to the ceramic housing by firing silver-loaded glass therebetween.

Still a further object of the present invention is to attach the integrated circuit chip to the ceramic housing by laminating a thermally filled polymer therebetween.

A further object of the present invention is to connect the integrated circuit chip connection pads to the housing wire bond pads by means of aluminum wedge bonding.

Another object of the present invention is to make connections between the hermetic package castellations and lead frame by means of thermal compression bonding.

An object of the present invention is to make connections at the hermetic package castellations and internal chip bond pads by means of thermal compression bonding.

Still a further object of the present invention is making thermal compression bonding connections by means of ultra-sonic compression.

Yet a further object of the present invention is to hermetically seal the ceramic package with a metal cover made of kovar.

An object of the present invention is to use a thin layer of polymer over the face of the integrated circuit chip for shielding from alpha particles.

A further object of the present invention is to laminate a lead frame to the ceramic housing with at least 0.3 mil thick adhesive.

Still a further object of the present invention is to connect the wire bond pad castellations on the exterior surface of the ceramic housing to the lead frame electrical conductors by means of soldering.

Another object of the present invention is to hermetically seal the ceramic housing and lid by means of solder preform rings on the housing seal ring layer and interface of the lid, respectively.

Yet another object of the present invention is to hermetically seal the ceramic housing and lid by means of seam or laser welding.

A further object of the present invention is to hermetically seal a ceramic housing to a ceramic lid by means of a glass seal.

Still a further object of the present invention is using a thin high temperature polymer layer over the lid for both electrical insulation of the lead frame and prevention of light entering the ceramic housing cavity.

A further object of the present invention is using a thin high temperature polymer layer over the solder seal to prevent contact of the hermetic seal when soldering together stacked ceramic packages by means of, for example, dipping into a solder fountain.

An object of the present invention is the use of a standard size ceramic housing and by means of various lead-on-chip lead frame configurations adapted to various sizes of integrated circuit chip dies, one standard housing connection format may be utilized.

An further object of the present invention is the use of a standard size ceramic housing and by means of various lead frame configurations adapted to various sizes of multiple integrated circuit chip dies, one standard housing connection format may be utilized for housing at least one chip.

An object of the present invention is the use of a ground plane with a lead frame for noise reduction in a ceramic housing that may be adapted for good thermal conduction and low impedance electrical connection of the ground plane.

Other and further objects, features and advantages will be apparent from the following description of the presently preferred embodiment of the invention, given for the purpose of disclosure and taken in conjunction with the accompanying drawings.

BRIEF DESCRIPTION OF THE DRAWINGS

FIG. 1 illustrates a ceramic integrated circuit package of the present invention in schematic top view and having the top cover removed so that the integrated circuit chip die contained therein is exposed;

FIG. 2 is a side view of FIG. 1;

DETAILED DESCRIPTION OF THE PREFERRED EMBODIMENT

Figure 5:
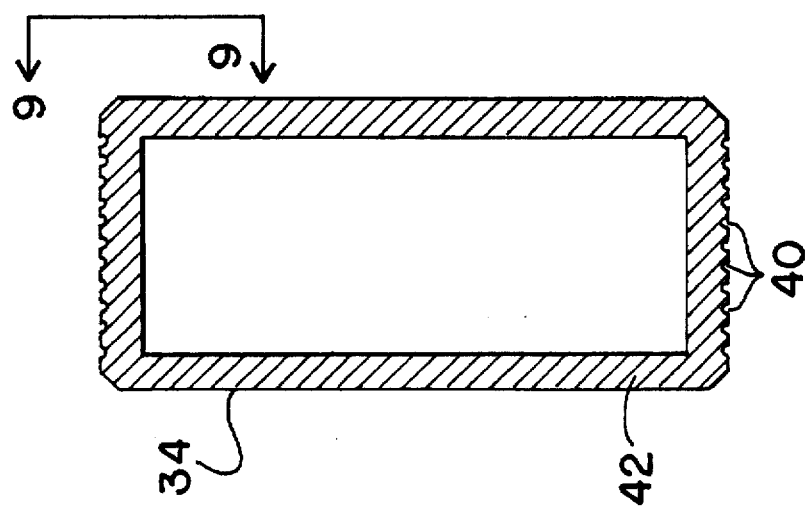
FIGS. 3–5 illustrate in schematic top views the base, wire bond pad and seal ring layers, respectively, which comprise the ceramic integrated circuit package assembly illustrated in FIG. 1.

A better understanding of the present invention will be obtained when the following detailed description is read with reference to the drawings wherein common elements are designated with like numbers or letters and similar elements are designated with like numbers followed by a lower case letter. Referring now to FIG. 1, a ceramic integrated circuit package having the top cover removed so that the integrated circuit chip die contained therein is exposed is illustrated in schematic top view. An integrated circuit ceramic housing assembly 20 surrounds an integrated circuit chip die 22. In FIG. 2 a side view of the ceramic housing 20 is illustrated.

Referring now to FIGS. 1–5, the ceramic housing 20 is comprised of three layers of ceramic and metal on ceramic. A ceramic base layer 30 (FIG. 3) makes up the bottom face of the ceramic package 20 and is used also for the attachment of the integrated circuit chip 22 (FIG. 1). A ceramic wire bond pad layer 32 (FIG. 4) is used for bringing electrical connections through the ceramic housing 20. Ceramic seal ring layer 34 (FIG. 5) is used to attach lid 44 (FIG. 16) when forming a hermetically sealed package. Housing 20 may be purchased from Coors Electronics Package Company as a prefabricated subassembly having base 30, bond pad layer 32, and insulated ceramic seal ring layer 34 fused together.

Figure 6:
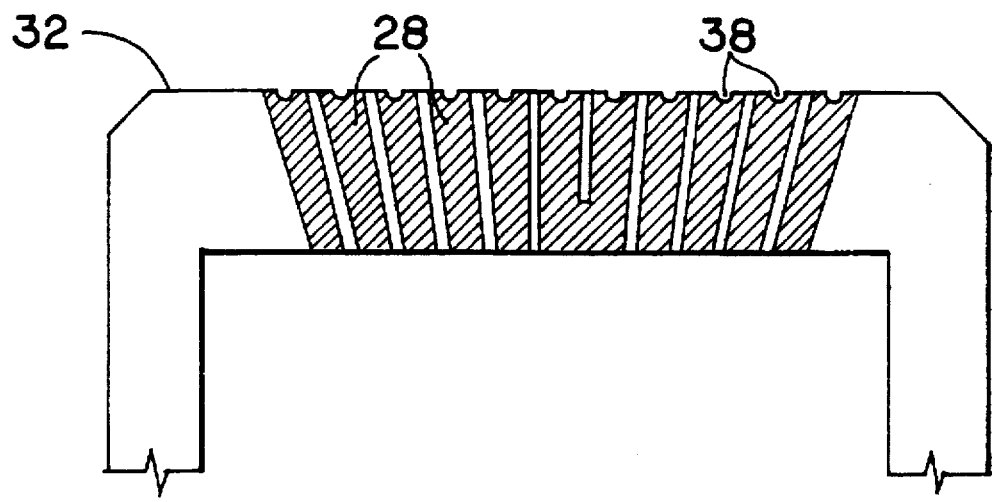
FIG. 6 illustrates in schematic top view an enlarged partial view of the wire bond pad layer of FIG. 4.

Electrical connections from chip die connection pads 24 are made to ceramic housing wire bond pads 28 by means of aluminum bond wires 26. Aluminum wire bonding of the integrated circuit chip 22 connection pads 24 to external package connections (wire bond pads 28) is well known to those in the art of fabricating integrated circuit packages. Housing wire bond pads 28 are more clearly illustrated in FIG. 6.

Figure 4:
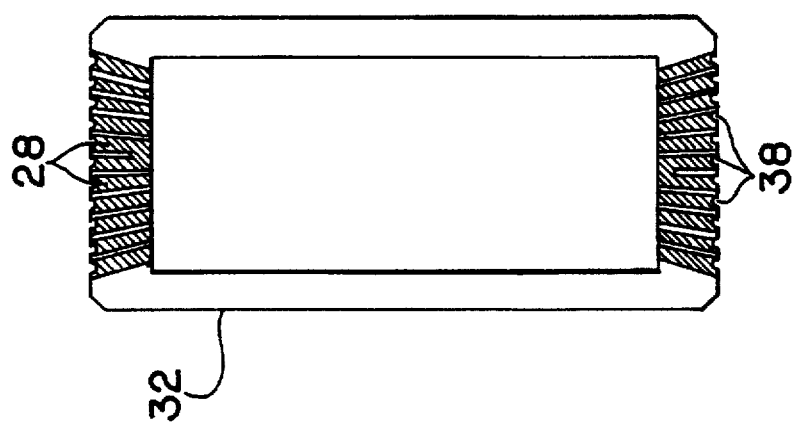
Figure 3:
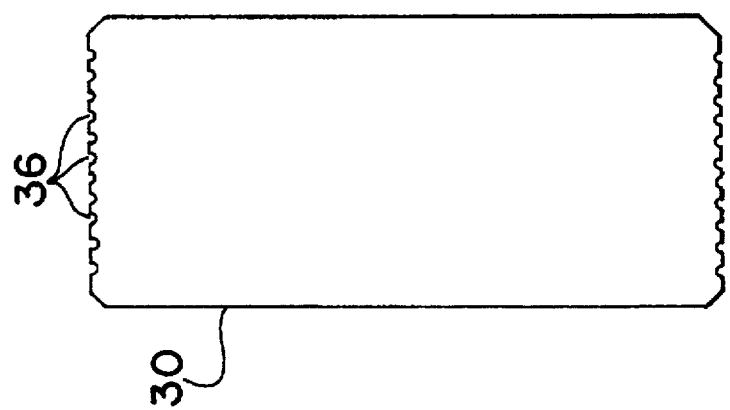

Referring now to FIGS. 3–5, base 30 has small indentations or castellations 36 that are metal plated 37 for connection to external circuit conductor means. Bond pad layer 32 has metal plated housing wire bond pads 28 connected to castellations 38. The insulated seal ring layer 34 has a preformed metalized seal ring 42, for example, gold plated and solder tinned for attaching to the lid 44 (FIG. 12) when hermetically sealing the housing 20. Seal ring 34 also has non-metalized castellations 40.

Figure 7:
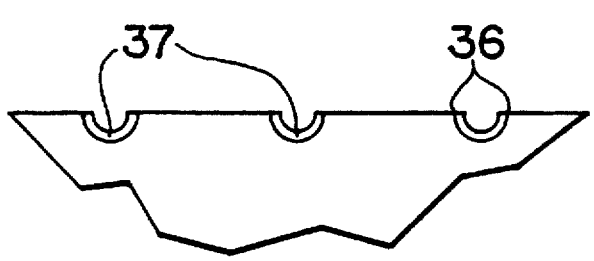
FIG. 7 illustrates in schematic top view an enlarged partial view of the base layer of FIG. 3.
Figure 8:
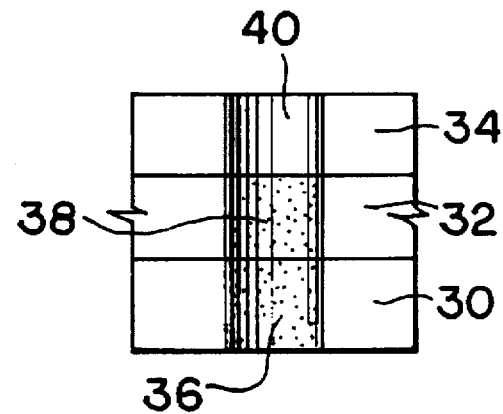
FIG. 8 illustrates section 8—8 of FIG. 1 in schematic elevational view.
Figure 9:
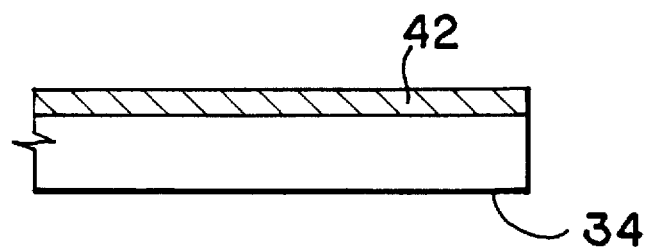
FIG. 9 illustrates section 9—9 of FIG. 5 in schematic elevational view.
Figure 14:
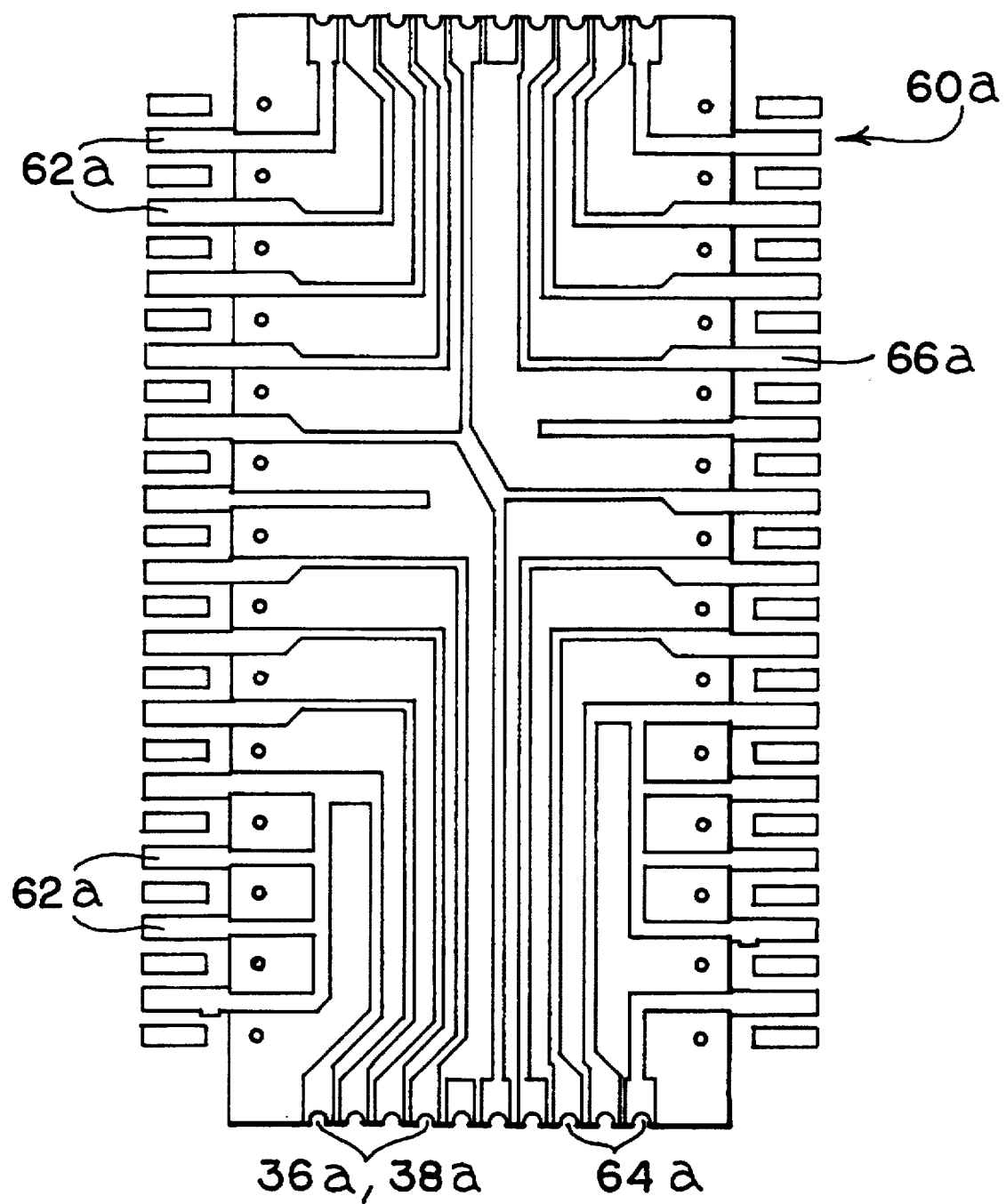
FIG. 14 illustrates the bottom of the ceramic integrated circuit package of FIG. 1 showing a lead frame attached thereto in schematic plan view.

Referring to FIGS. 7 and 8, castellations 36, 38 and 40 are small indentations which facilitate the attachment of a lead frame (FIG. 14) for electrically connecting the integrated circuit chip 22 electrical signals to the electronic system. Castellations 36 and 38 are metalized as illustrated in FIG. 8 and castellation 40 is not metalized. This selective metalization of castellations 36 and 38 allow more uniform control of lead frame connections to bond pads 28 during flow soldering operations. FIG. 9 illustrates seal ring 34 and the preformed seal ring metalization 42 attached thereto.

Figure 11:
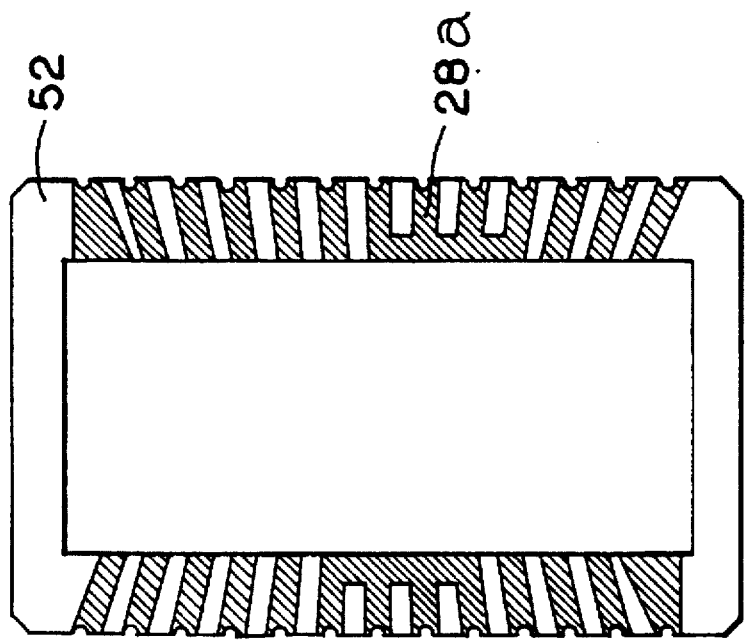
FIG. 11 illustrates in schematic top view the wire bond pad layer of the ceramic integrated circuit package assembly of FIG. 10.
Figure 10:
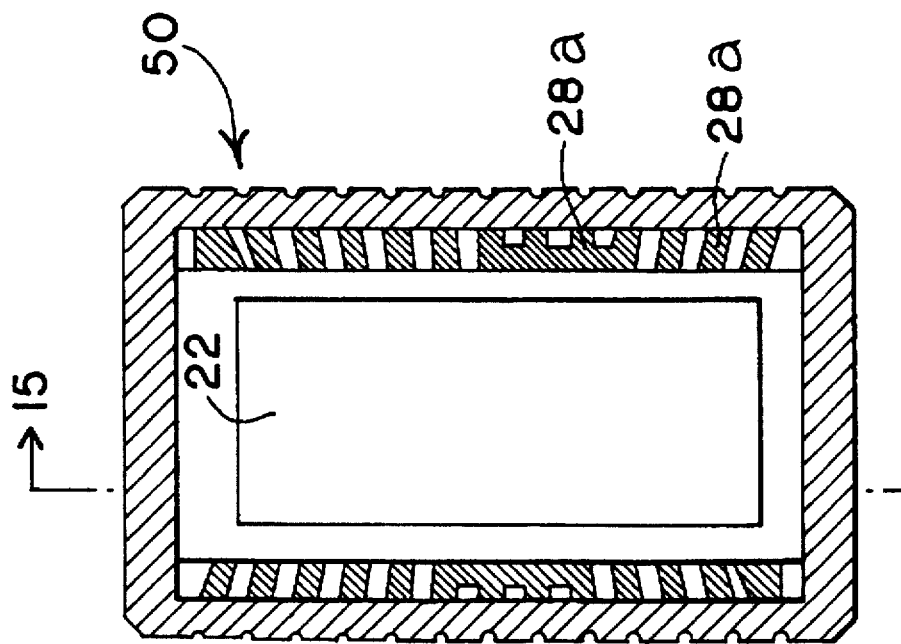
FIG. 10 illustrates another embodiment of the ceramic integrated circuit package of the present invention in schematic top view.

Another embodiment of the present invention is illustrated in FIG. 10. An integrated circuit ceramic housing assembly 50 has bond pads 28a parallel with the long axis of chip 22. This arrangement of bond pads 28a may allow more connections to the chip 22 contained within housing 50. FIG. 11 illustrates a ceramic wire bond pad layer 52 representative of what would be used in fabrication of housing 50.

Figure 12:
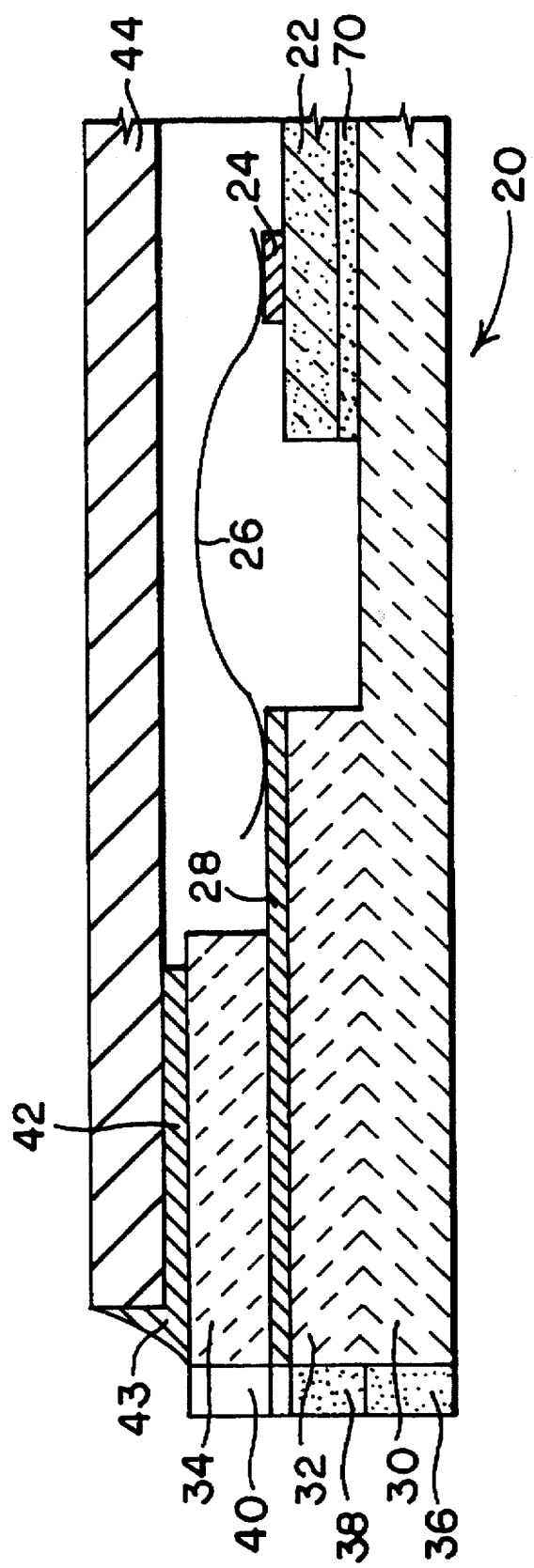
FIG. 12 illustrates section 12—12 of FIG. 1 in schematic elevational view.
Figure 13:
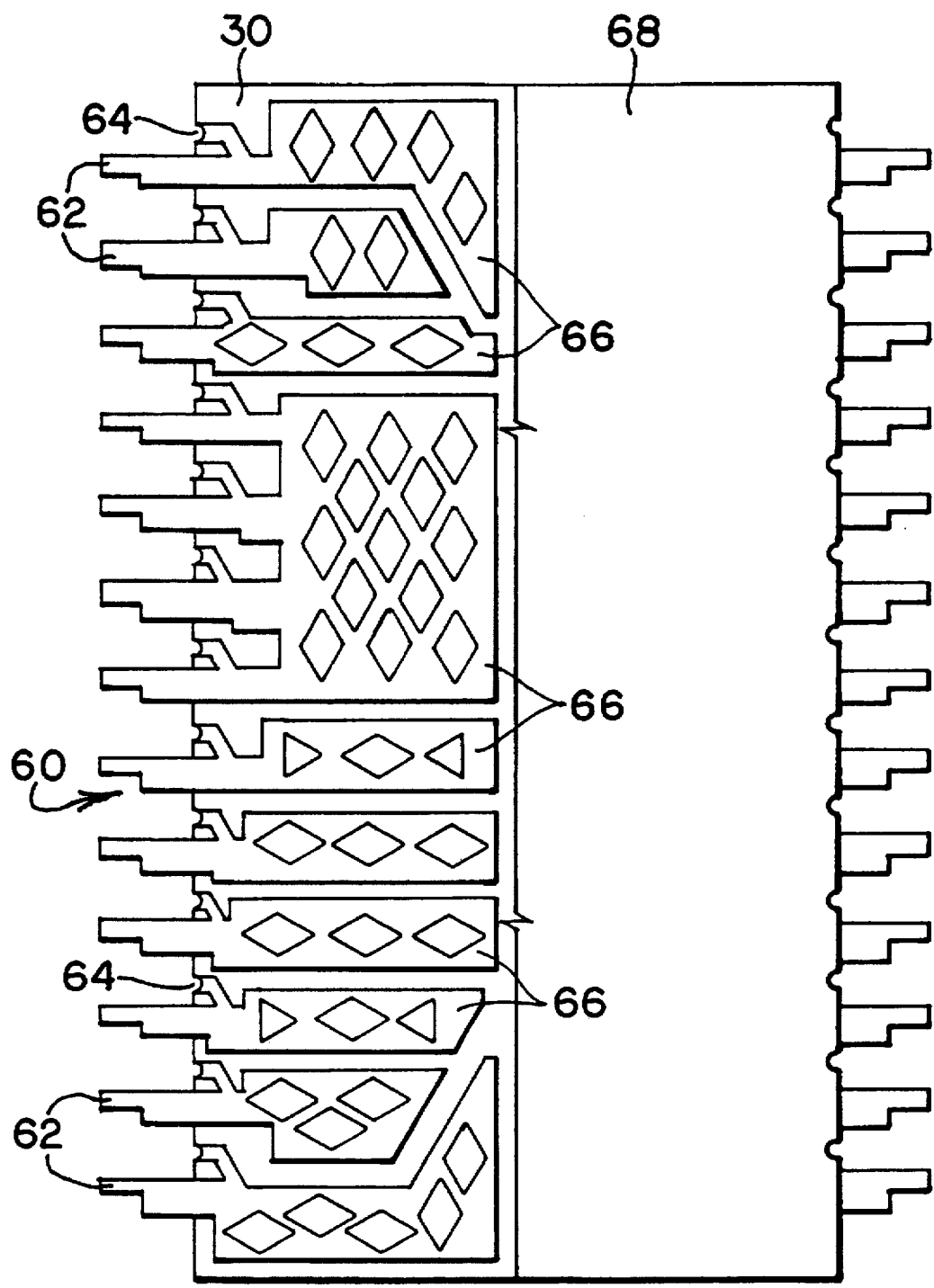
FIG. 13 illustrates the bottom of the ceramic integrated circuit package of FIG. 10 showing a lead frame attached thereto in schematic plan view.

FIG. 12 illustrates a cross-section 12—12 of FIG. 1 in schematic elevational view. Layers 30, 32 and 34 are readily illustrated. Chip die connection pads 24 are connected to housing wire bond pads 28 by means of aluminum wire bonds 26. Bond pads 28 continue out to connect with the external metalized castellations 38 which ultimately are connected to a lead frame 60 (FIG. 13). Lead frame 60 includes a plurality of electrical conductors which are fixedly aligned with the housing bond pads 28 through the castellations 38.

Figure 12A:
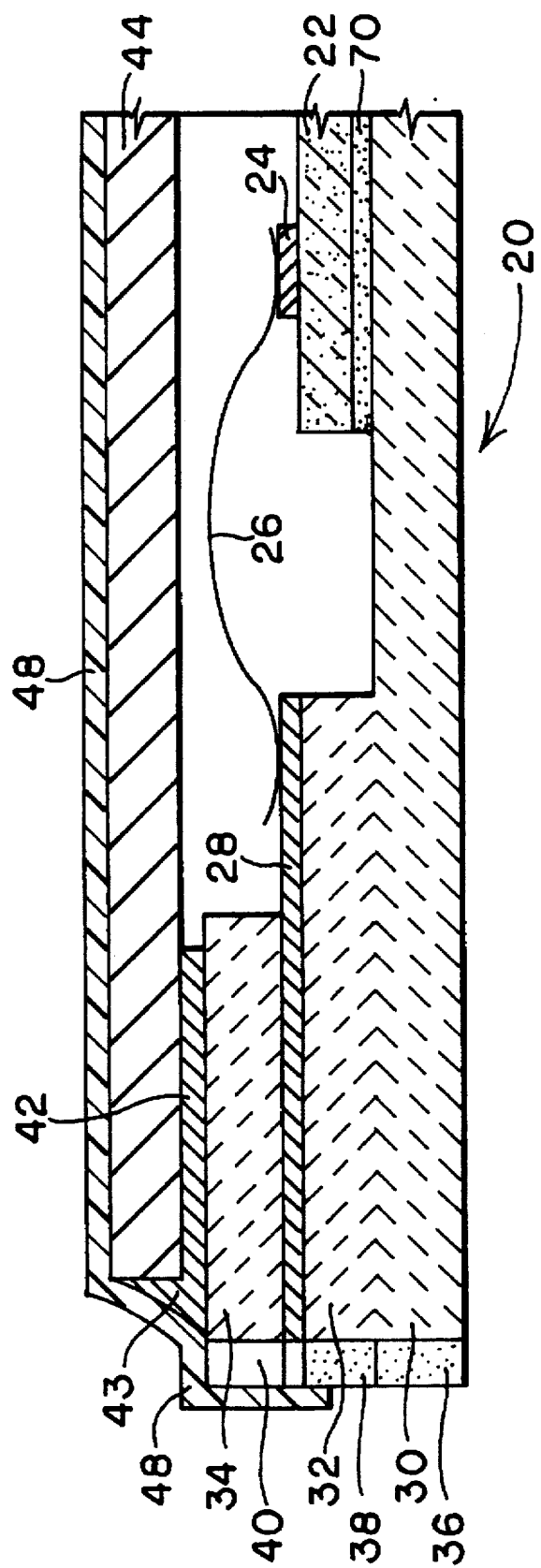
FIG. 12a illustrates a polymer insulating layer over the top of the ceramic package of the present invention in schematic elevational view.

FIG. 12a illustrates a cross-section of 12—12 of FIG. 1 having a polymer cap or tent 48 over the lid 44, preform solder seal ring 42 and edge of the seal ring 34. The tent 48 is used to insulate the lid 44 from contact with an exposed lead frame of another ceramic package when stacking ceramic packages together, one on top of another. The tent also covers the solder seal 42 and fillet 43 and is used as a solder mask to prevent solder from coming into contact with seal 42 and fillet 43 during a solder dipping operation.

Chip 22 may be attached to base 30 by thermally conductive adhesive 70 which may be, for example, silver-loaded glass manufactured by Johnson-Mathey. The silver-loaded glass adhesive 70 may be used to attach chip 22 to base 30 by firing the assembly comprising chip 22, adhesive 70 and base 30 wherein the glass melts and fuses chip 22 to base 30.

Housing 20 may be hermetically sealed to lid 44 by placing the housing 20 and lid 44 assembly in a nitrogen filled oven wherein a preformed solder ring on seal ring layer preformed metalization 42 reflows. The housing seal ring 34 may be tinned with solder, if there is no preformed solder ring. Lid 44 is also preferably tinned with solder. After lowering the oven temperature the solder forms an air-tight hermetic seal between housing 20 and lid 44. Once cooled, a hermetic seal is formed between housing 20 and lid 44. A solder fillet 43 (FIG. 12) forms on the outside of the interface between lid 44 and seal ring layer 34. Alternately, the seal may be made by seam or laser welding, or a glass seal in conjunction with a ceramic lid.

After the housing 20 is hermetically sealed to lid 44, a lead frame 60 is attached to the bottom exterior face of the ceramic base layer 30 as illustrated in FIG. 13. Lead frame 60 is comprised of lead frame connection pins 62, lead frame castellation connections 64 and lead frame heat transfer members 66. The castellation connections 64 connect to the bond pad and base layer castellations 38 and 36, respectively. Pins 62 connect to the electronic system circuits. The heat transfer members 66 are used to efficiently transfer heat flowing through the thin base layer 30 from the integrated circuit die 22. The base layer 30 has sufficiently large surface area to rapidly transfer heat from integrated circuit chip 22 into heat transfer members 66 where the heat flows through pins 62 into the electronic system for ultimate heat removal. This new, novel and non-obvious method and structure for heat removal enables rapid transfer of heat flow through the extremely thin ceramic base layer 30. Having the heat transfer members 66 in close communication and covering most of the surface area of base 30 aids in the rapid removal of heat from the integrated circuit package of the present invention.

Figure 16:
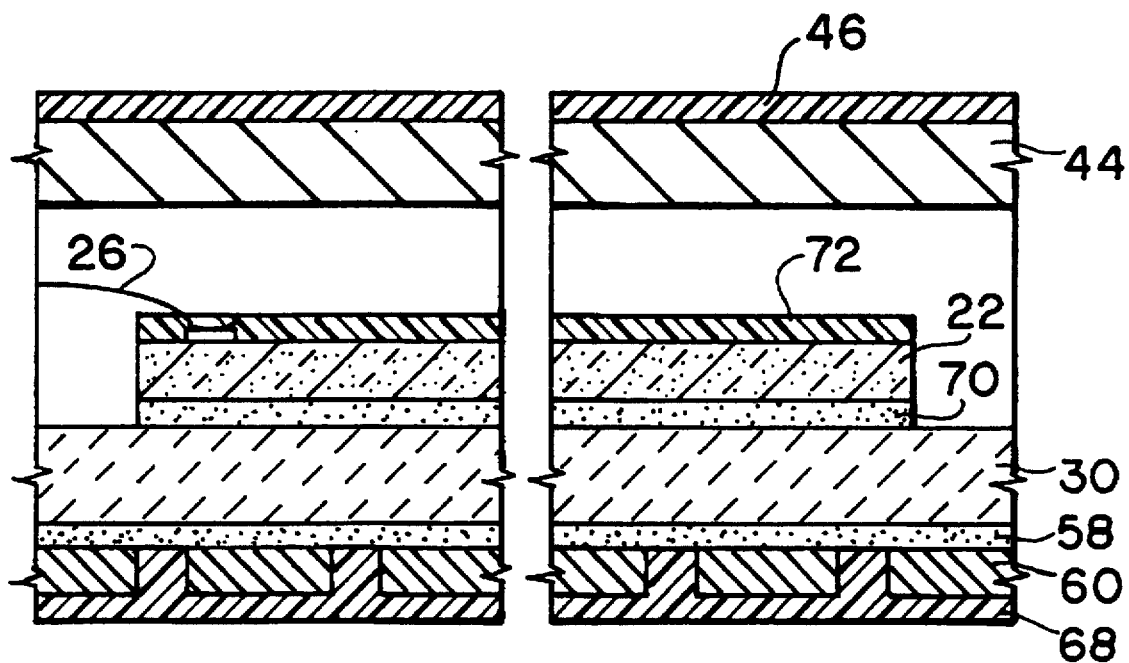
FIG. 16 illustrates a partial cross section of the present invention in schematic elevational view.

Integrated circuit chips are sensitive to alpha particle bombardment and light (photon disturbances). Referring now to FIG. 16, a cross-section of a schematic elevational view is illustrated. Alpha particles may be shielded by coating lid 44 with a thin polymer layer 46. An insulating polymer film 72 may also be placed on the face of chip 22. Polymer film 72 acts as a shield to effectively absorb alpha particles.

Light (photon) emissions may cause soft errors in digital data integrated circuits. The ceramic base layer 30 may be as thin as 8 mils in thickness, which, unless opaque ceramic material is used, will allow light to pass onto the integrated circuit chip 22. A light shield may be formed from a thin layer of polymer 68. In addition, insulation 68 may also be utilized to prevent lead frame 60 from shorting to conductive materials in communication with the bottom of housing 20. FIG. 13 illustrates insulation 68 that has been cut away, exposing the lead frame 60. This situation may result when several integrated circuit packages are stacked one on top of the other in high density packaging applications. Without insulation 68, the lead frame 60 may short to the metal lid 44. The top integrated circuit package housing assembly 20 lead frame 68 may short to the bottom integrated circuit package housing 20 metal lid 44.

Figure 15:
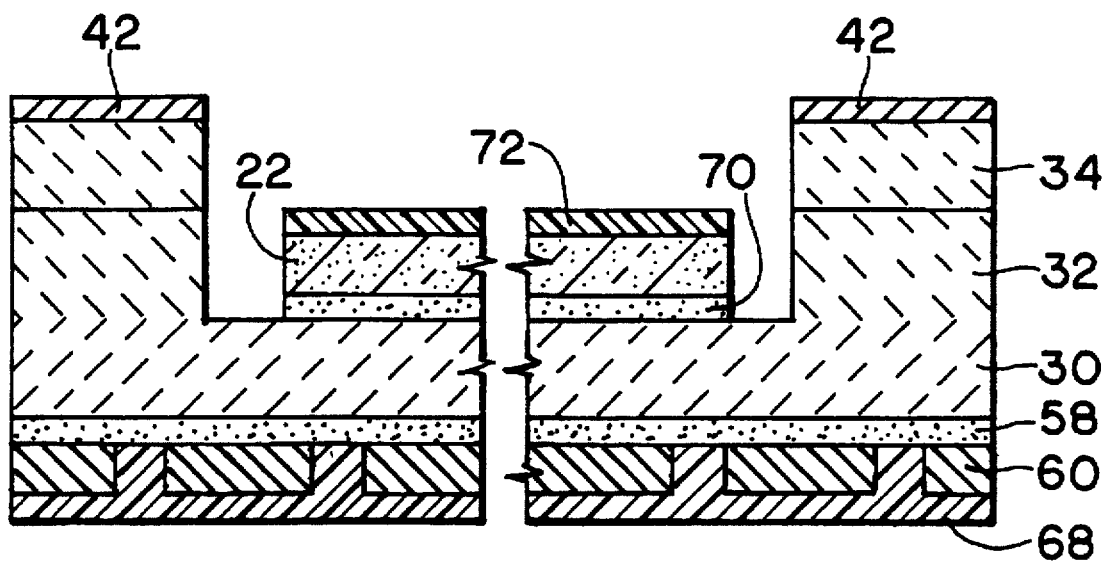
FIG. 15 illustrates section 15—15 of FIG. 10 in schematic elevational view.

FIG. 15 is a schematic cross-section elevational view of FIG. 10 which illustrates ceramic layers 30, 32 and 34, chip 22, adhesive 70, polymer shield 72, lead frame 60 and lead frame insulator and light shield 68. FIG. 16 is a schematic elevation view of a cross-section of the present invention illustrating, from top to bottom, lid 44 having polymer layer 46, polymer alpha particle shield 72 covering integrated circuit chip die 22 which is electrically connected by means of aluminum wire bonds 26 and mechanically attached to ceramic base 30 by means of thermally conductive adhesive 70. A lead frame 60 is laminated to the exterior face of base 30 by means of lead frame adhesive 58 and lead frame 60 is protected from electrical shorting by insulation 68 which may also serve as a light (photon) shield.

Figure 17:
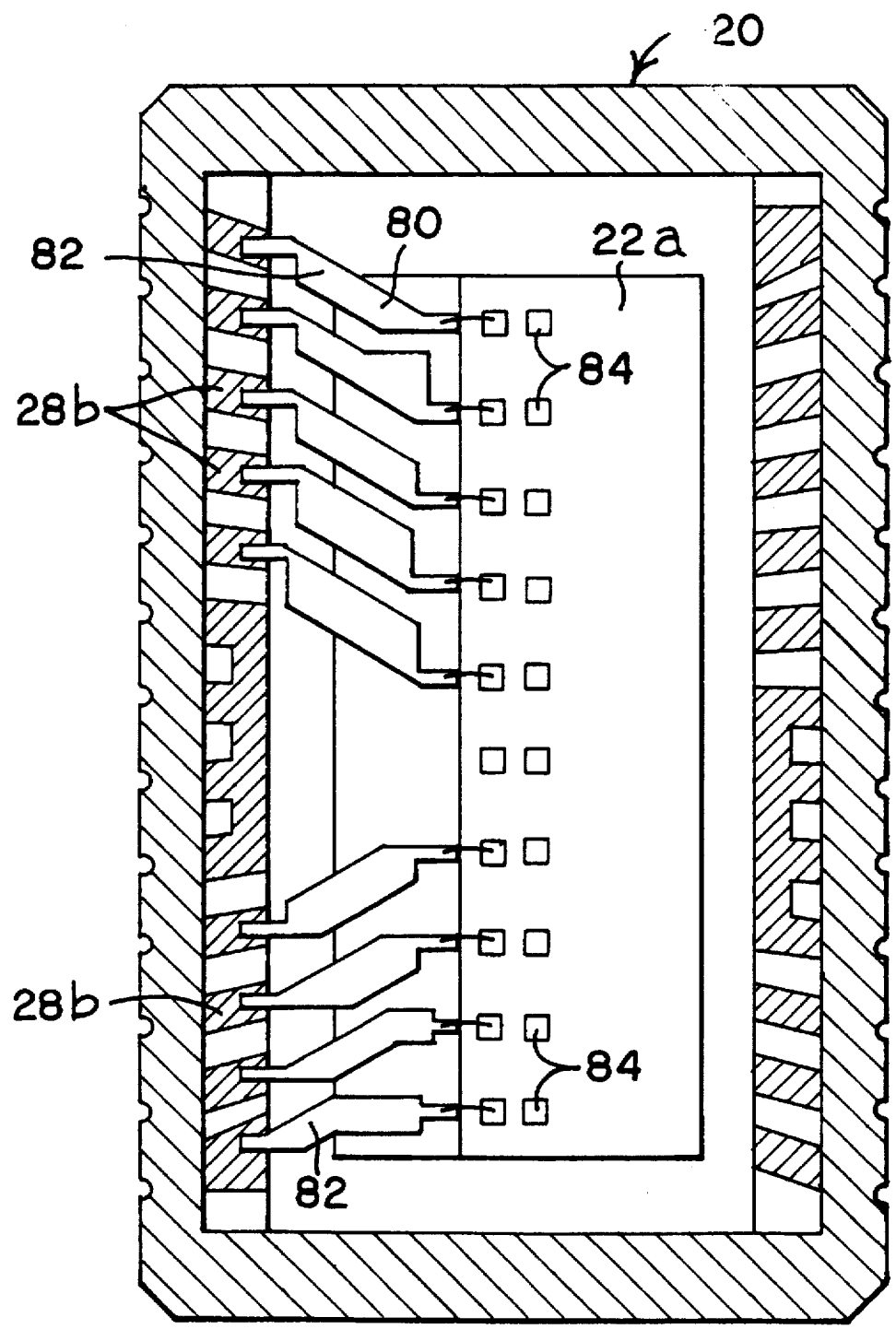
FIG. 17 illustrates a ceramic integrated circuit package of the present in schematic top view and having the top cover removed so that the lead-on-chip integrated circuit contained therein is exposed.
Figure 18A:
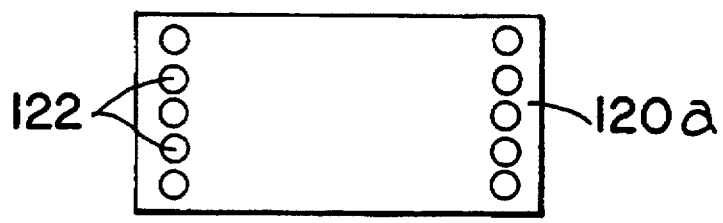
FIG. 18 illustrates embodiments of metal ground planes in schematic top view.
Figure 18B:
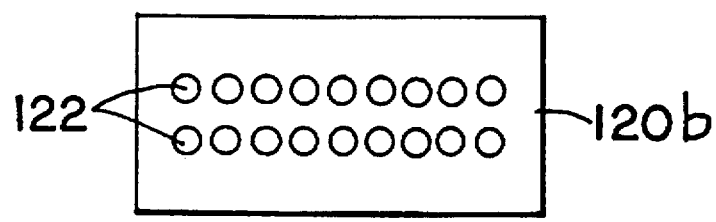
Figure 18C:
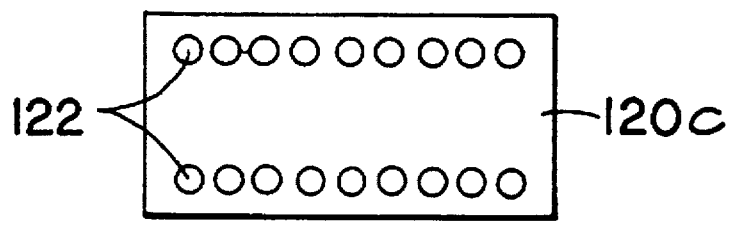
Figure 19A:
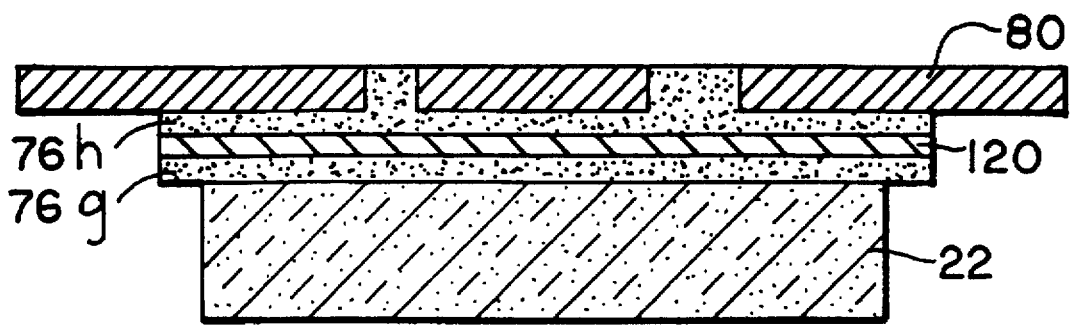
FIGS. 19a, 19b and 19c illustrate preferred embodiments of the present invention in schematic elevational views.
Figure 19B:
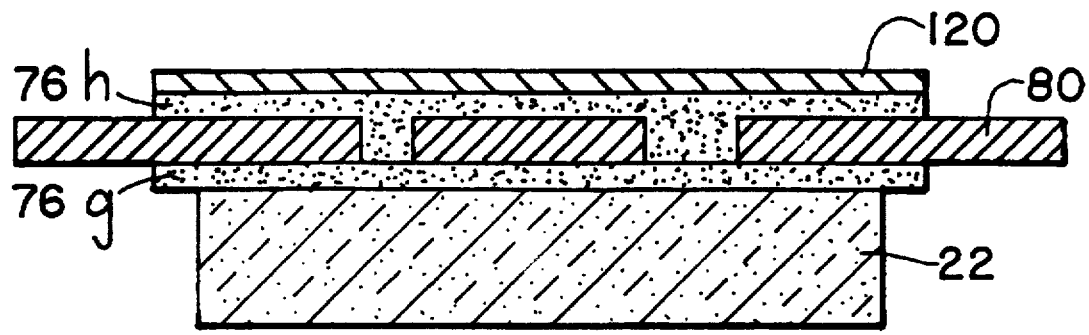
Figure 19C:
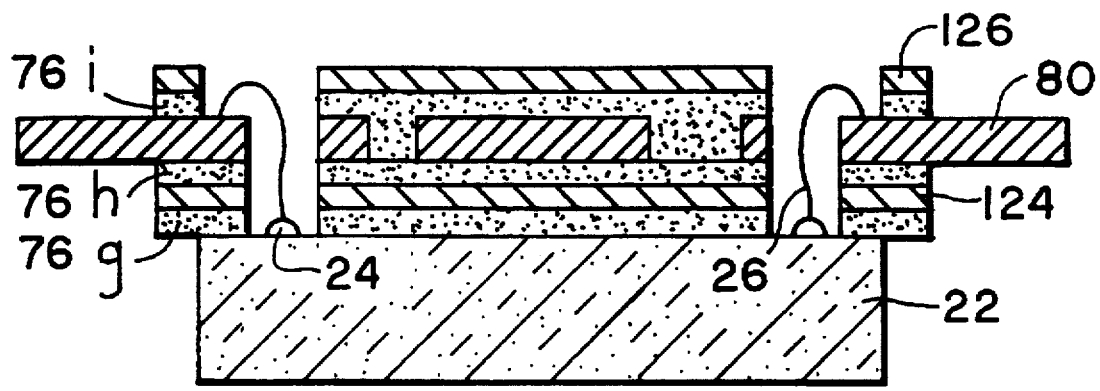

Referring now to FIG. 17, an integrated circuit chip die 22a having a lead-on-chip lead frame 80 laminated thereto, is mounted within the housing 20 and the lead frame 80 electrical conductors 82 attach to bond pads 28b. Integrated circuit chip die 22a may be of any size or electrical connection configuration because the lead frame 80 may be adapted to connect the chip die 22a bond pads 84 to the housing 20 bond pads 28b. By so doing, physical design of packaging components may be standardized without regard to the type of integrated circuit chip die 22a or variance from one manufacturer to another.

Referring now to FIGS. 18, 19a, 19b and 19c, a unique aspect of the present invention is a heat spreading metal ground plane 120 either between the face of the IC chip die 22 and the lead-on-chip lead frame 80, above the lead frame 80 or both using two ground planes 124 and 126, sandwiching the lead frame 80 therebetween. By electrically connecting the metal ground plane 120 to appropriate electrical connections (not illustrated) within the electronic system, electrical noise may also be greatly reduced.

Selection of the lead frame 80 conductor dimensions and spacing between the metal ground plane 120 affords a controlled impedance of the lead frame conductors for improved high frequency operation of the IC devices. The metal ground plane 120 and lead frame 80 may form either a stripline or microstrip system when using one or two ground planes, respectively. Design of stripline and microstrip systems are well known in the radio frequency arts. The spacing between the ground plane 120 and lead frame 80 may be controlled by the thickness of adhesive 76.

Use of ground plane 120 to reduce IC circuit noise and/or to control signal impedances allows improvements in the operating speeds of ICs such as static random access memory (SRAM) and dynamic random access memory (DRAM). Both SRAM and DRAM are used to store digital data and are sensitive to system noise and signal settling times. Signal settling time is the time required for a signal to obtain a stable state without noise present such as ringing or standing wave reflections. Both of these noise types result from impedance mismatching in a high frequency signal system.

Ground induced noise may also be present because of inadequate conductor size. High frequency currents resulting from rapid switching speeds tend to travel only on the surface of a metal conductor and is called the "skin effect". By making the surface area of conductors required to carry large and rapidly changing ground currents, ground noise due to charging and discharging circuit capacitance when switching logic states is greatly reduced.

The ground plane 120 may be used to spread heat flow, it may also be used to reduce noise, or it may additionally be used in conjunction with the lead frame 80 for constant impedance signal transmission lines. The ground plane 120 may connect only to selected leads of the lead frame 80 or the ground plane 120 may extend beyond the chip 22 for connection to a ceramic housing adapted to have a heat dissipation system, noise grounding system and/or constant impedance signal transmission system as an integral part of the ceramic housing (not illustrated).

Figure 20:
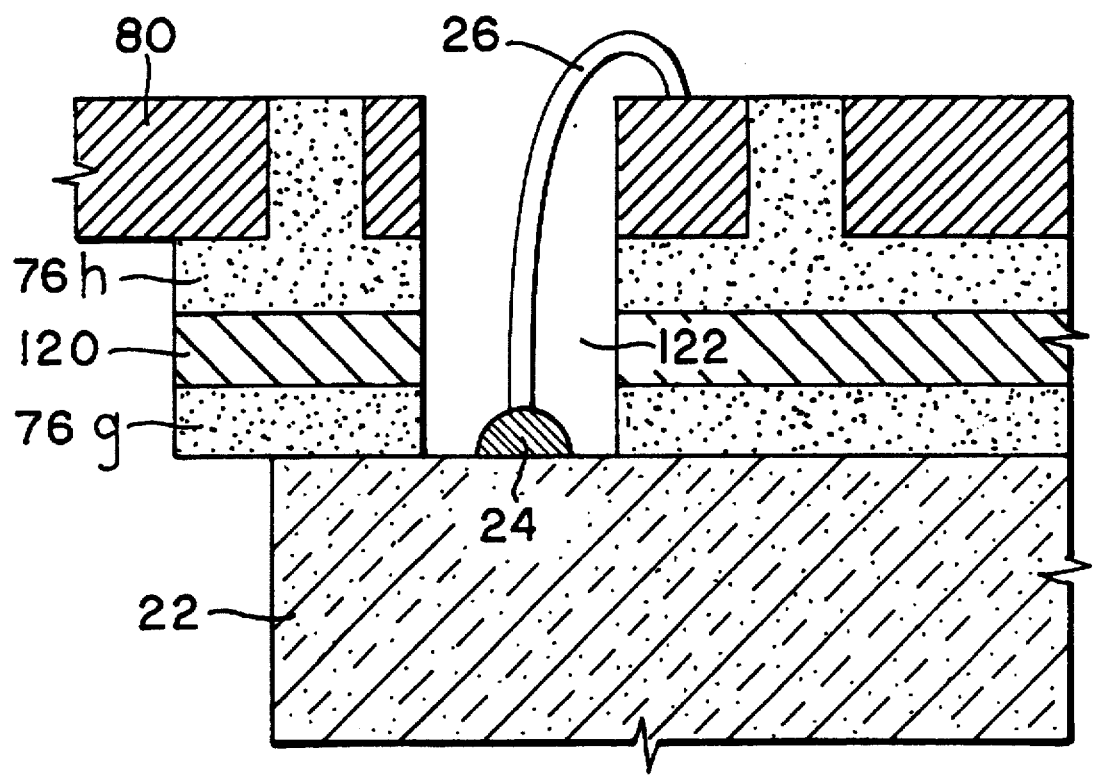
FIG. 20 illustrates a preferred embodiment of the present invention in a partial schematic elevational view.

Referring now to FIG. 20, holes 122 in the metal ground plane 120 may be placed to easily facilitate interconnection of the lead frame 80 to the IC chip connection pads 24, for example, by means of bond connections 26. Different patterns of holes 122 (FIG. 18) may be used for chip connection pads 24 on the perimeter or within the interior plane of the chip face. The ground plane 120 may be connected to selected conductors of the lead frame 80 or to external connections independent of the lead frame 80 (not illustrated). Multiple electrical or thermal mechanical connections to the ground plan 120 will improve the effective noise reduction and heat dissipation properties of the IC package 112, respectively.

Figure 21:
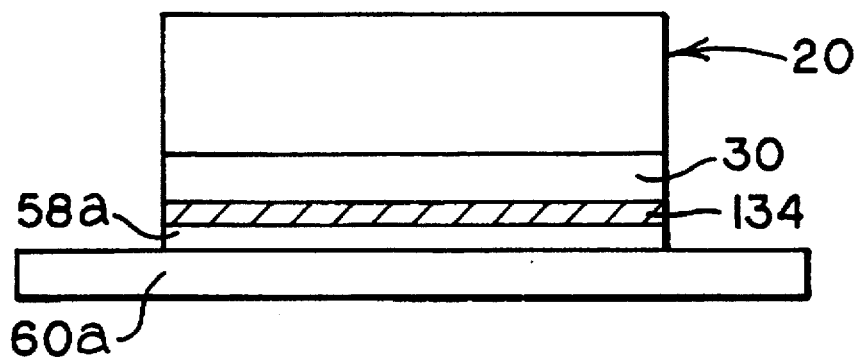
FIG. 21 illustrates a preferred embodiment of the present invention in schematic elevational view.

Referring now to FIG. 21, a thin layer of metal 134 such as, for example, copper or metalized ceramic on the base layer 30 of the ceramic housing 20 is illustrated. The metal 134 may be used as a ground plane for lead frame 60a and may be used to increase the thermal conductivity of the ceramic package 20 because it will improve heat spreading. The metal 134 may be, for example, 1 mil copper with about a 0.3 mil adhesive to attach it to the base layer 30 bottom face of the ceramic package 20. Lead frame 60a is attached to the metal 134 by adhesive 58a. Ground plane metal 134 may be adapted for connection to a heat dissipation system, noise grounding system and/or constant impedance signal transmission system (not illustrated).

Figure 22:
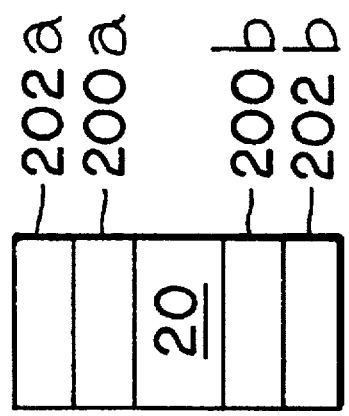

Referring to FIG. 22, a Lead-On-Package configuration is illustrated. A first lead frame 200a, which includes a plurality of conductive elements (not shown) formed in a substantially plainer thermally conductive element is mounted to the upper surface of ceramic package 20. A second lead frame 200b is mounted to the lower surface of ceramic package 20. Selected lead frame conductors of the first and second lead frame 200a,b are connected to selected package circuit conductors (not shown) by the method previously explained. A first heat spreader 202a is mounted in heat exchange relationship to the first lead frame 200a and a second heat spreader 202b is mounted in the heat exchange relationship to the second lead frame 200b.

Figure 23:
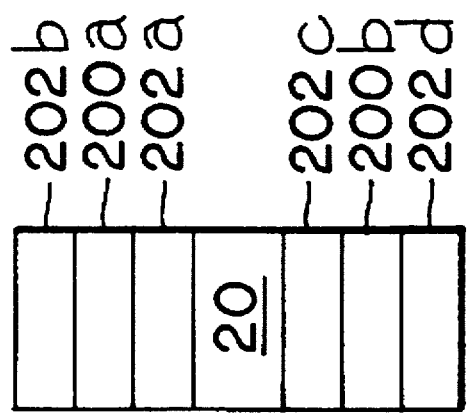

Referring to FIG. 23, a first heat spreader 202a is mounted in heat exchange relationship to the upper major surface of ceramic package 20. A first lead frame 200a is mounted to the first heat spreader 202a. A second heat spreader 202b is then mounted to the first lead frame 200a and heat exchange relationship. A third heat spreader 202c is mounted in heat exchange relationship to the lower major surface of ceramic package 20. A second lead frame 200b is mounted in heat exchange relationship to the third heat spreader 202c. A fourth heat spreader 202d is then mounted in heat exchange relationship to second lead frame 200b.

Figure 24:
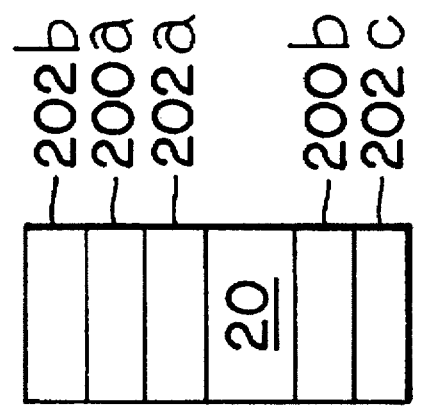
FIGS. 22, 23 and 24 illustrate Lead-On Package configurations with upper and lower exterior surfaces.

Referring to FIG. 24, a first heat spreader 202a is mounted in heat exchange relationship to the upper major surface of ceramic package 20. A first lead frame 200a is then mounted in heat exchange relationship to first heat spreader 202a. A second heat spreader 202b is then mounted in heat exchange relationship to first lead frame 200a. A second lead frame 200b is mounted in heat exchange relationship to the lower major surface of ceramic package 20. A third heat spreader 202c is then mounted in heat exchange relationship to second lead frame 200b.

This completes the description of the preferred embodiments of the method and apparatus of a hermetically sealed ceramic integrated circuit package having good thermal conductivity for efficiently transferring heat from an integrated circuit chip die contained therein. The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. A method of manufacturing a hermetically sealed ceramic integrated circuit package having good thermal conductivity for efficiently transferring heat from an integrated circuit chip die contained therein, comprising the steps of:

attaching at least one integrated circuit chip in a ceramic housing comprising a base, wire bond pads and seal ring, said integrated circuit chip having a face with circuit connection pads thereon and positioned wherein the face is accessible from within said ceramic housing;

connecting said ceramic housing wire bond pads to said integrated circuit connection pads;

attaching a cover to said ceramic housing seal ring wherein said cover and housing are hermetically sealed together;

attaching a lead frame to said ceramic housing base, said lead frame having a plurality of electrical conductors that are fixedly aligned with said housing wire bond pads; and connecting said lead frame conductors to said housing wire bond pads.

2. The method of claim 1, wherein the step of attaching an integrated circuit chip in a ceramic housing comprises the step of firing silver loaded glass therebetween.

3. The method of claim 1, wherein the step of connecting said housing wire bond pads to said integrated circuit connection pads comprises the step of aluminum wedge bonding.

4. The method of claim 1, wherein the step of attaching a cover to said housing comprises the steps of:

tinning the housing seal ring with solder;

tinning the cover with solder;

placing in a nitrogen filled oven said housing and said cover, said cover on top of and in communication with said housing seal ring;

heating said housing solder tinned seal ring and cover until the solder melts; and cooling said housing and cover whereby a hermetic seal is formed therebetween.

5. The method of claim 1 after the step of connecting said housing wire bond pads to said integrated circuit connection pads, further comprising the step of attaching a thin polymer layer onto said integrated circuit chip face for alpha particle shielding.

6. The method of claim 1 after the step of connecting said lead frame, further comprising the step of attaching a thin insulating layer to the lead frame.

7. The method of claim 1 after the step of attaching a cover, further comprising the step of attaching a thin insulating layer over the cover and hermetic seal.

8. A method of manufacturing a hermetically sealed ceramic integrated circuit package having a standard size and housing various sizes of integrated circuit chips with connections thereto made by means of a first lead frame laminated onto the face of the chip, the package having good thermal conductivity for efficiently transferring heat from the integrated circuit chip die contained therein, comprising the steps of:

attaching at least one integrated circuit chip having an active face and having a first lead frame laminated to said active face in a ceramic housing comprising a base, bond pads and seal ring, said integrated circuit first lead frame having a plurality of conductors connected to connection pads of said integrated circuit chip and positioned wherein said first lead frame is accessible from within said ceramic housing;

connecting said ceramic housing bond pads to said first lead frame conductors; and attaching a cover to said ceramic housing seal ring wherein said cover and housing are hermetically sealed together.

9. The method of claim 8, further comprising the steps of:

attaching a second lead frame to an exterior major surface of said ceramic housing base, said second lead frame having a plurality of electrical conductors that are fixedly aligned with said housing bond pads; and connecting said second lead frame conductors to said housing wire bond pads.

10. The method of claim 1, wherein the step of attaching a cover to said housing comprises the step of welding said cover to said housing seal ring.

11. The method of claim 1, wherein the step of attaching a cover to said housing comprises the step of sealing with glass.

12. The method of claim 1, wherein the step of attaching an integrated circuit chip in a ceramic housing comprises the step of laminating a thermally filled polymer therebetween.

13. The method of claim 1, wherein the step of connecting includes thermal compression bonding.

14. A method of manufacturing a lead frame on an integrated circuit package of a type having at least one substantially planar major exterior surface, said method comprising the steps of:

mounting a lead frame comprised of a plurality of conductive elements formed in a substantially planar thermally conductive element to a first exterior major surface of an integrated circuit package, said package having a plurality of circuit conductors; and connecting selected ones of said lead frame conductors to selected ones of said integrated circuit package circuit conductors.

15. The method of claim 14, wherein the step of mounting said lead frame is with thermally conductive adhesive.

16. The method of claim 14, wherein the step of connecting selected ones of said lead frame conductors to selected ones of said integrated circuit package circuit conductors is by soldering.

17. The method of claim 14, wherein the step of connecting selected ones of said lead frame conductors to selected ones of said integrated circuit package conductors is by thermal compression bonding.

18. The method of claim 14, further comprising a step of covering said package with polymeric film.

19. The method of claim 14, further comprising a step of mounting a heat spreader in heat exchange relationship to said lead frame.

20. The method of claim 19, wherein said package has a first and a second major surface, said method further comprising the step of mounting a second heat spreader in heat exchange relationship to said second major surface of said integrated circuit package.

21. The method of claim 20, further comprising the step of mounting a second lead frame in heat exchange relationship to a second major surface of said second heat spreader.

22. The method of claim 21, further comprising the step of mounting a third heat spreader in heat exchange relationship to a second major surface of said second lead frame.

23. The method of claim 19, wherein said heat spreader comprises an electrically conductive ground plane adapted for connection to an electrical signal ground.

24. The method of claim 23, further comprising the step of providing holes in said ground plane to facilitate connection to selected ones of said lead frame conductors.

25. The method of claim 14, further comprising the step of mounting a heat spreader in heat exchange relationship to a second major surface of said integrated circuit package.

26. The method of claim 25, wherein said package has a first and a second major surface, said method further comprising the step of mounting a second lead frame comprised of a plurality of conductive elements formed in a substantially planar thermally conductive element in heat exchange relationship to said heat spreader.

27. The method of claim 25, wherein said heat spreader comprises an electrically conductive ground plane adapted for connection to an electrical signal ground.

28. A method of manufacturing a lead frame on an integrated circuit package of a type having upper and lower substantially planar exterior major surfaces, said method comprising the steps of:

mounting a first lead frame comprised of a plurality of conductive elements formed in a substantially planar thermally conductive element to said upper major surface of an integrated circuit package, said package having a plurality of circuit conductors;

mounting a second lead frame comprised of a plurality of conductive elements formed in a substantially planar thermally conductive element to said lower exterior major surface of said integrated circuit package; and connecting selected ones of lead frame conductors of said first and second lead frames to selected ones of said integrated circuit package circuit conductors.

29. The method of claim 28, wherein the steps of mounting first and second lead frames to upper and lower major surfaces, respectively, of said integrated circuit package is with thermally conductive adhesive.

30. The method of claim 28, wherein the step of connecting selected ones of said lead frame conductors of said first and second lead frames to selected ones of said integrated circuit package circuit conductors is by soldering.

31. The method of claim 28, wherein the step of connecting selected ones of said lead frame conductors of said first and second lead frames to selected ones of said integrated circuit package circuit conductors is by thermal compression bonding.

32. The method of claim 28, further comprising the step of covering said package with polymeric film.

33. The method of claim 28, further comprising the step of mounting a first heat spreader in heat exchange relationship to said first lead frame.

34. The method of claim 33, wherein said first heat spreader comprises an electrically conductive ground plane adapted for connection to an electrical signal ground.

35. The method of claim 34, further comprising the step of providing holes in said ground plane to facilitate connection to selected ones of said first lead frame conductors.

36. The method of claim 28, further comprising the step of mounting a second heat spreader in heat exchange relationship to said second lead frame.

37. The method of claim 36, wherein said second heat spreader comprises an electrically conductive ground plane adapted for connection to an electrical signal ground.

38. The method of claim 37, further comprising the step of providing holes in said ground plane to facilitate connection to selected ones of said second lead frame conductors.

39. The method of claim 28, further comprising the step of mounting a first heat spreader in heat exchange relationship to said first lead frame and mounting a second heat spreader in heat exchange relationship to said second lead frame.

40. The method of claim 39, wherein said first heat spreader comprises an electrically conductive ground plane adapted for connection to an electrical signal ground.

41. The method of claim 40, further comprising the step of providing holes in said first ground plane to facilitate connection to selected ones of said first lead frame conductors.

42. The method of claim 39, wherein said second heat spreader comprises an electrically conductive ground plane adapted for connection to an electrical signal ground.

43. The method of claim 42, further comprising the step of providing holes in said second ground plane to facilitate connection to selected ones of said second lead frame conductors.

44. The method of claim 39, wherein said first and second heat spreaders comprise electrically conductive ground planes adapted for connection to an electrical signal ground.

45. The method of claim 44, further comprising the step of providing holes in said first and second ground planes to facilitate connection to selected ones of said first and second lead frame conductors.

46. The method of claim 44, further comprising the step of selecting the thickness of thermally conductive adhesive used to mount said electrically grounded first and second heat spreaders to obtain a controlled impedance stripline system.

47. A method of manufacturing a lead frame on an integrated circuit package of a type having upper and lower substantially planar exterior major surfaces, said method comprising the steps of:

mounting a heat spreader in heat exchange relationship to said upper major surface of an integrated circuit package, said package having a plurality of circuit conductors;

mounting a lead frame comprised of a plurality of conductive elements formed in a substantially planar thermally conductive element to said upper major surface of said heat spreader; and connecting selected ones of said lead frame conductors to selected ones of said integrated circuit package circuit conductors.

48. The method of claim 47, further comprising the step of covering said package with polymeric film.

49. The method of claim 47, further comprising the step of mounting a second heat spreader in heat exchange relationship to said lower major surface of said integrated circuit package.

50. The method of claim 49, further comprising the step of mounting a second lead frame comprised of a plurality of conductive elements formed in a substantially planar thermally conductive element in heat exchange relationship to said second heat spreader.

51. The method of claim 47, further comprising the step of mounting a second heat spreader in heat exchange relationship to said said first lead frame.

52. The method of claim 51, further comprising the step of mounting a third heat spreader in heat exchange relationship to said lower major surface of said integrated circuit package.

53. The method of claim 51, further comprising the step of mounting a second lead frame comprised of a plurality of conductive elements formed in a substantially planar thermally conductive element in heat exchange relationship to said lower major surface of said integrated circuit package.

54. The method of claim 53, further comprising the step of mounting a third heat spreader in heat exchange relationship to said second lead frame.

55. The method of claim 52, further comprising the step of mounting a second lead frame in heat exchange relationship to a third heat spreader.

56. The method of claim 55, further comprising the step of mounting a fourth heat spreader in heat exchange relationship to a second lead frame.

* * * * *

UNITED STATES PATENT AND TRADEMARK OFFICE
CERTIFICATE OF CORRECTION

PATENT NO. : 5,702,985
DATED : December 30, 1997
INVENTOR(S) : Carmen D. Burns

It is certified that error appears in the above-identified patent and that said Letters Patent is hereby corrected as shown below:

Column 2, line 65, delete "difference" and insert therefor -- different -- .
Column 6, line 18, delete "Found" and insert therefor -- Ground -- .
Column 6, line 65, delete "plan" and insert therefor -- plane -- .
Column 8, line 39, delete "An" and insert therefor -- A -- .
Column 9, line 31, between "present" and "in" insert -- invention -- .

Signed and Sealed this

Twenty-eighth Day of April, 1998

Attest:

BRUCE LEHMAN

*Attesting Officer*  *Commissioner of Patents and Trademarks*